(12) United States Patent
Vivares et al.

(10) Patent No.: US 6,432,291 B1
(45) Date of Patent: Aug. 13, 2002

(54) SIMULTANEOUS ELECTROPLATING OF BOTH SIDES OF A DUAL-SIDED SUBSTRATE

(75) Inventors: Valerie Vivares, Palo Alto; Robert Newman, Santa Clara; Edwin R. Fontecha, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/641,434

(22) Filed: Aug. 18, 2000

(51) Int. Cl.$^7$ ................................. C25D 5/02
(52) U.S. Cl. ................. 205/125; 205/163; 205/165; 205/167
(58) Field of Search ................. 205/125, 163, 205/165, 167

(56) References Cited

U.S. PATENT DOCUMENTS

| | | |
|---|---|---|
| 4,545,885 A | 10/1985 | Hori et al. |
| 4,595,480 A | 6/1986 | Takiar et al. |
| 4,758,927 A | 7/1988 | Berg |
| 4,768,077 A | 8/1988 | Scherer |
| 4,878,990 A | 11/1989 | Dugan et al. |
| 5,468,993 A | 11/1995 | Tani |
| 5,541,447 A | 7/1996 | Maejima et al. |
| 5,819,398 A | 10/1998 | Wakefield |
| 5,976,341 A * | 11/1999 | Schumacher et al. ....... 205/125 |

* cited by examiner

Primary Examiner—Arun S. Phasge

(57) ABSTRACT

A method of simultaneously electroplating both sides of a dual-sided circuit board substrate having electrically connected, multi-trace circuit patterns formed on both sides of the substrate, without requiring formation and at least partial removal of electrically conductive tie bars and associated extensions, comprises steps of simultaneously electrically contacting each feature of a first one of the circuit patterns with a multi-fingered electrical contactor, and applying an electrical potential to the contactor to effect simultaneous electroplating on the circuit patterns on both sides of the substrate. According to an embodiment of the invention, the multi-fingered contactor comprises an array of electrically conductive wires, rods, or filaments extending from one surface of a metal plate. The invention finds particular utility in the fabrication of ball grid array (BGA) semiconductor device packages.

17 Claims, 4 Drawing Sheets

SIMULTANEOUS ELECTROPLATING OF BOTH SIDES OF A DUAL-SIDED SUBSTRATE

FIELD OF THE INVENTION

The present invention relates to electroplating both sides of a workpiece in the form of substantially flat, electrically insulative substrate having electrically interconnected circuit patterns formed on a pair of opposed major surfaces. More particularly, the present invention relates to a method for simultaneously electroplating at least one metal or metal alloy layer on electrically interconnected patterns on both surfaces of a circuit board substrate utilized for mounting and providing electrical connections to a semiconductor integrated circuit (IC) die or chip, as in ball grid array (BGA) device packages.

BACKGROUND OF THE INVENTION

Electrical circuit boards and similar type components comprising complex, electrically interconnected circuit patterns formed on opposite sides of a planar, insulative substrate enjoy widespread utility in the manufacture of electrical and electronic components and devices. For example, an increasingly important aspect of semiconductor integrated circuit (IC) manufacturing technology is mounting of the semiconductor IC die or chip to an appropriately configured dual-sided substrate as part of a process for forming encapsulated device packages. Frequently, this requires providing the IC chip or die with as many input/output ("I/O") terminals as is feasible. As a consequence of the requirement for a large number of terminals to be formed on a limited amount of substrate surface, so-called "ball grid array" ("BGA") structures and bonding techniques have been developed in order to provide high areal density interconnections between the IC package and, e.g., a larger substrate.

A typical, encapsulated BGA type semiconductor IC device package (1) is shown in schematic, cross-sectional view in FIG. 1. According to such BGA type packaging, an IC die or chip (2) is mounted on a patterned, upper solder mask layer (3U) formed on the upper major surface (4U) of a dual-sided substrate (4), i.e., a dual-sided printed circuit board ("PCB") or a ceramic or composite material circuit board ("CCB") having an upper circuit pattern (5U) formed thereon. A plurality of electrical connections (6) comprising fine electrical wires, typically of gold (Au), are connected, as by wire bonding, between the upper surface (2U) of the IC die or chip (2) and a plurality of electrical bonding pad areas (7B) (also termed "bond fingers") of the upper circuit pattern (5U) exposed through a plurality of openings (3') selectively formed in solder mask layer (3U). Each of the electrically conductive traces or lines forming upper circuit pattern (5U) is electrically connected by means of an electrically conductive plug or via (7V) filling a through-hole (8) extending through the thickness of substrate (4), to at least one electrically conductive trace or line of a lower circuit pattern (5L) formed on the lower major surface (4L) of the substrate. A plurality of generally circularly-shaped "ball land" areas are exposed through openings (3") selectively formed in lower solder mask layer (3L) overlying substrate lower major surface (4L) for accommodating therein a spaced-apart plurality of substantially spherically-shaped electrical conductors (9) formed of a solder material and constituting a two-dimensional ball grid array (BGA). Finally, BGA package (1) includes a layer of molding material (10) encapsulating at least the IC die or chip (2).

According to BGA methodology, the device package with its substantially spherically-shaped BGA solder balls or bumps is then mated with a corresponding ball grid array (BGA) or bonding pad array formed on a substrate surface. Once mated, the solder balls or bumps of the IC device package and the corresponding solder balls or bumps or bonding pads of the substrate are heated to effect reflow and mutual bonding, whereby each solder ball or bump forms a bond between the IC device package and the substrate. As a consequence, each bonded combination functions as both an electrical and physical contact.

A variant of the above BGA bonding technology, known as "controlled collapse chip connection", or "C4", is particularly useful in applications having a very high density of electrical interconnections. According to C4 methodology, electrically conductive balls or bumps comprising a solder material are formed on the IC device package, as well as on the mating surface of the substrate. Bonding between the two sets of solder balls or bumps is effected by application of heat and mechanical pressure to the IC device package and the substrate. The application of heat causes both sets of solder-based balls or bumps to reflow, thereby providing physical and ohmic electrical connection therebetween, while the applied mechanical pressure causes the mated pairs of solder-based balls or bumps to at least partially collapse, creating a "pancake" shape which advantageously reduces interconnection length and resistance.

An essential feature of the above-described BGA fabrication methodology is the formation of suitable dual-sided substrates (4) having the requisite electrically interconnected circuit patterns (5U, 5L) formed on the opposing major surfaces (4U, 4L), wherein the circuit patterns are provided with one or more plated layers for minimizing corrosion due to environmental factors, etc., and for facilitating wetting and adhesion of solder-type contact materials thereto. However, the continuing increase in complexity of the IC chip or die (2) has necessitated a parallel increase in the number of I/O connections required to be made to the IC chip or die. The increase in IC complexity has necessitated a parallel increase in the number and complexity of the requisite electrically conductive traces constituting the upper and lower circuit patterns formed on the substrate, which increase in number and complexity has in turn resulted in a substantial decrease in the inter-trace spacings.

According to conventional methodologies for manufacturing dual-sided circuit boards suitable for use in BGA type packaging applications, multi-trace electrically conductive patterns, typically of copper (Cu) or a Cu-based alloy, are formed, as by conventional techniques, on both major surfaces of a substrate comprised of at least one electrically insulative material selected from polymers, ceramics, glasses, resins, laminates, and composites thereof, e.g., an epoxy resin-fiberglass composite, and electrically interconnected by means of a plurality electrically conductive via plugs filling through-holes extending between the opposing major surfaces.

FIG. 2A illustrates, in plan view, a corner portion of the upper major surface (4U) of a first example of a dual-sided substrate (4), wherein each of the individual traces (5T$_U$) of upper circuit pattern (5U) is shown as extending from the interior portion of upper major surface (4U), where bond fingers (7B) are located, to the periphery thereof, where conductive via plugs (7V) are formed for electrical interconnection with the lower circuit pattern (4L), which pattern is not necessarily similarly configured. The thus-formed, electrically interconnected upper and lower circuit patterns (5U, 5L) are then subjected to a plating process, conventionally electroplating, for depositing thereon a layer or layer system which provides corrosion resistance and facilitates low ohmic resistance bonding of solder-based electrical conductors thereto. Typically, thin layers of Ni and Au are sequentially electroplated over the Cu or Cu-based circuit patterns (5U, 5L) for this purpose. According to conventional electroplating processes, at least one electrically conductive tie bar (11) having several lateral extensions (11L, 11R), etc., is formed on at least one of the upper or lower major surfaces (4U or 4L) and in electrical contact with each of the conductive traces on that surface, thereby providing a common electrical conductor for connection to a source of electroplating potential, whereby each of the electrically interconnected conductive traces ($5T_U$, $5T_L$) on the upper and lower major surfaces (5U, 5L), respectively, are able to be simultaneously electroplated. The electrical connections between the various conductive traces and tie bar (11) and its several extensions (11L, 11R), etc., are severed after completion of electroplating.

While the use of electrically tie bars for facilitating simultaneous electroplating of circuit patterns on opposite substrate surfaces has been generally useful according to prior practices, as a consequence of the increased densification of the traces forming the circuit patterns as required by the progressive increase in IC complexity, the remaining, or free space (or "real estate") on the major surfaces (5U, 5L) of the substrate has progressively been reduced to where it currently is at a premium. Stated somewhat differently, trace densification of the circuit patterns has reached a state where the tie bar (11) and its associated extensions (11L, 11R), etc., disadvantageously and deleteriously occupy precious routing space on the substrate surface needed for the additional traces, vias, etc., required by the increased amount of I/O connections to be made to the IC chip or die. Moreover, the presence of the tie bar(s) and associated extensions disadvantageously decreases the signal-to-noise ratio ("SNR") of the completed device package, and the need to sever the electrical connections between the tie bar and the conductive traces subsequent to electroplating adds additional steps and complexity to the overall substrate preparation process.

FIG. 2B illustrates, in plan view, a corner portion of the upper major surface (4U) of a second example of a dual-sided substrate (4) of conventional type, wherein each of the individual traces ($5T_U$) of the upper circuit pattern (5U) includes a separate tie bar portion (11') for supplying the electrically interconnected upper and lower circuit patterns (5U, 5L) with an electrical potential, typically of negative polarity, for cathodically electroplating thereon a layer or layer system (i.e., a plurality of stacked layers) which, inter alia, provides corrosion resistance and facilitates low ohmic resistance bonding of solder-based electrical conductors thereto. However, as in the first example illustrated in FIG. 2A, the individual tie bar portions (11') of this example disadvantageously occupy precious "real estate" on the substrate surface, which "real estate" is currently at a premium due to the increased trace densification resulting from the increase in device complexity.

Accordingly, there exists a need for improved methodology for performing simultaneous electroplating of dual-sided circuit board substrates in a simple, reliable, and rapid manner, which methodology eliminates the need for providing an electrically conductive tie bar(s) and associated extensions in electrical contact with the individual conductive traces and other features constituting the conductive circuit patterns prior to electroplating, obviates the need to severing of the contacts subsequent to electroplating, and advantageously increases the SNR of the completed device package.

The present invention, wherein a multi-fingered electrical contactor is urged into simultaneous touching electrical contact with contact portions of each of the electrically conductive features comprising an electrical circuit pattern on a first one of a pair of opposed major surfaces of a substrate, facilitates and simplifies simultaneous electroplating of the first and the second electrically conductive patterns on the opposed major surfaces. The present invention therefore addresses and solves the need for improved methodology for simultaneous electroplating of at least one metal or metal alloy layer on electrically interconnected circuit patterns on both sides of a dual-sided substrate, while eliminating the need for providing and subsequently severing an electrically conductive tie bar and its associated lateral extensions. The inventive methodology thus results in process simplification while freeing precious surface area of the substrate major surfaces for use in forming additional conductive traces thereon, and advantageously increases the SNR of the completed device package. Further, the methodology provided by the present invention enjoys diverse utility in the manufacture of numerous and various types of electrical and electronic devices and/or components utilizing dual-sided circuit board substrates.

DISCLOSURE OF THE INVENTION

An advantage of the present invention is an improved method for simple, rapid, reliable, simultaneous electroplating of both major surfaces of printed circuit board and other types of dual-sided substrates comprising electrically interconnected conductive patterns.

Another advantage of the present invention is an improved method of simultaneously electroplating both major surfaces of dual-sided circuit board substrates utilized in fabricating ball grid array (BGA) semiconductor IC device packages.

Yet another advantage of the present invention is an improved dual-sided circuit board for use in fabricating BGA semiconductor device packages.

Additional advantages and other features of the present invention will be set forth in the description which follows and in part will become apparent to those having ordinary skill in the art upon examination of the following or may be learned from the practice of the present invention. The advantages of the present invention may be realized as particularly pointed out in the appended claims.

According to one aspect of the present invention, the foregoing and other advantages are obtained in part by a method of electroplating a dual-sided workpiece, which method comprises the steps of:

(a) providing a workpiece comprising an electrically insulative substrate including first and second opposed major surfaces, with respective first and second pluralities of electrically conductive features formed on the first and the second major surfaces, each one of the first plurality of electrically conductive features on the first major surface being electrically interconnected to at least one of the second plurality of electrically conductive features on the second major surface;

(b) providing an electrical contactor in simultaneous touching electrical contact with each feature of one of the first and second pluralities of electrically conductive features; and (c) contacting the first and second major surfaces of the substrate with at least one electroplating bath while applying an electrical potential to the electrical contactor, and simultaneously electroplating at least one layer on the first and the second pluralities of electrical features.

According to embodiments of the present invention, step (a) comprises providing as the workpiece a dual-sided circuit board comprising a substrate having flat planar first and second opposed major surfaces, wherein the first and the second pluralities of electrically conductive features each include a plurality of spaced-apart, electrically conductive traces forming respective first and second circuit patterns, and the pluralities of electrically conductive traces of the first and the second electrical circuit patterns are electrically interconnected by a plurality of electrically conductive vias extending through the thickness of the substrate.

According to various alternate embodiments of the present invention, step (a) comprises providing as the workpiece a substrate wherein the entire surface areas of each of the first and the second electrical circuit patterns are exposed; or step (a) comprises providing as the workpiece a substrate wherein the entire surface area of one the electrical circuit patterns is exposed and only selected portions of the other electrical circuit pattern are exposed through openings formed in an overlying layer of masking material; or step (a) comprises providing as the workpiece a substrate wherein only selected portions of the surface areas of each of the first and the second electrical circuit patterns are exposed through openings formed in a respective overlying layer of masking material.

According to embodiments of the present invention, step (a) comprises providing a substrate for a semiconductor device package having a ball grid array (BGA) contact arrangement, each of the layers of masking material comprises a solder mask material, and the selected portions of the first and second electrical circuit patterns exposed through the openings in the respective overlying layers of solder mask material form bonding pad areas on the first major surface and a spaced-apart array of generally circularly-shaped ball land areas on the second major surface.

According to particular embodiments of the present invention, step (a) comprises providing a substrate for a BGA contact arrangement wherein each of the generally circularly-shaped ball land areas further includes an electrical contact area extending from the periphery thereof; and step (b) comprises providing the electrical contactor in simultaneous touching electrical contact with each of the electrical contact areas of the spaced-apart array of ball land areas, wherein step (b) comprises providing as the electrical contactor an electrically conductive plate, with one end of each of a plurality of electrically conductive wires, filaments, or rods conductively affixed to one side of the plate, the plurality of conductive wires, filaments, or rods extending from the one side of the plate in a spaced-apart array configured to correspond to the spaced-apart array of ball land areas, and urging the other, free end of each wire, filament, or rod into touching electrical contact with a respective electrical contact area.

According to embodiments of the present invention, step (a) comprises providing a dual-sided circuit board comprising at least one electrically insulative material selected from the group consisting of polymers, ceramics, glasses, resins, laminates and composites thereof; and step (c) comprises electroplating at least one metal or metal alloy layer on the first and second pluralities of electrically conductive features.

According to particular embodiments of the present invention, step (a) comprises providing a dual-sided circuit board including first and second pluralities of copper (Cu) or Cu-based features; and step (c) comprises sequentially electroplating nickel (Ni) and gold (Au) layers thereon.

According to another aspect of the present invention, a method of manufacturing an electrical device comprises:

(a) providing an electrically insulative substrate having substantially planar upper and lower major surfaces, each of the upper and the lower major surfaces including thereon a plurality of electrically conductive traces forming respective upper and lower electrical circuit patterns, the traces of the upper electrical circuit pattern being electrically interconnected with the traces of the lower electrical circuit pattern by means of electrically conductive vias extending through the substrate;

(b) applying a layer of an electrically insulative masking material on each of the upper and the lower electrical circuit patterns;

(c) selectively removing portions of each layer of masking material to expose selected surface portions of the plurality of electrically conductive traces comprising each of the upper and the lower electrical circuit patterns;

(d) providing an electrical contactor in simultaneous touching electrical contact with each selected surface portion of one of the upper and the lower electrical circuit patterns; and (e) contacting the upper and the lower surfaces of the substrate with at least one electroplating bath and applying a cathodic electrical potential to the electrical contactor and simultaneously electroplating at least one metal or metal alloy layer on the exposed surface portions of the upper and the lower electrical circuit patterns.

According to embodiments of the present invention:

step (a) comprises providing an electrically insulative substrate comprised of a material selected from the group consisting of polymers, ceramics, glass, resins, laminates, and composites thereof;

step (b) comprises applying a layer of a solder mask material on each of the upper and the lower major surfaces of the substrate and covering the respective upper and lower electrical circuit patterns; and step (c) comprises selectively removing portions of the solder mask layer from the upper circuit pattern to expose a plurality of electrically conductive bonding pad areas and selectively removing portions of the solder mask layer from the lower circuit pattern to expose a plurality of generally circularly-shaped ball land areas in a spaced-apart array for accommodating an array of spaced-apart, substantially spherically-shaped electrical conductors for a ball grid array (BGA).

According to particular embodiments of the present invention, step (c) includes forming an electrically conductive contact area extending from the periphery of each of the generally circularly-shaped, exposed, ball land areas of the lower circuit pattern; and step (d) comprises providing as the electrical contactor an electrically conductive plate, with one end of each of a plurality of electrically conductive wires, filaments, or rods conductively affixed to one side of the plate, the plurality of conductive wires, filaments, or rods extending from the one side of the plate in a spaced-apart array configured to correspond to the spaced-apart array of ball land areas, and urging the other, i.e., free, end of each wire, filament, or rod into touching electrical contact with a respective electrical contact area.

According to embodiments of the present invention, step (a) comprises providing a substrate wherein each of the upper and lower electrical circuit patterns includes a plurality of copper (Cu) or Cu-based traces; step (e) comprises sequentially electroplating a nickel (Ni) layer and a gold (Au) layer on each of the exposed areas of each of the upper and the lower electrical circuit patterns; and the method comprises the further steps of:

(f) affixing a substantially spherically-shaped electrical conductor to each of the plurality of exposed areas of the lower electrical circuit pattern to form a ball grid array (BGA);

(g) mounting a semiconductor integrated circuit (IC) die or chip on the layer of solder mask material on the upper major surface of the substrate;

(h) forming at least one electrical connection between the IC die or chip and at least one of the bonding pad areas of the upper electrical circuit pattern; and (i) encapsulating at least the IC die or chip in a molding material.

According to still another aspect of the present invention, a dual-sided circuit board comprises:

an electrically insulative substrate having substantially planar upper and lower major surfaces, each of the upper and the lower major surfaces including thereon a plurality of electrically conductive traces forming respective upper and lower electrical circuit patterns, each of the traces of the upper electrical circuit pattern being electrically interconnected with the traces of the lower electrical circuit pattern by means of a plurality of electrically conductive vias extending through the thickness of the substrate; and a layer of an electrically insulative masking material formed over each of the upper and the lower electrical circuit patterns, each of the layers of masking material including a plurality of openings extending therethrough and exposing selected surface portions of the upper and lower electrical circuit patterns, the exposed surface portions of the upper electrical circuit pattern defining a plurality of electrically conductive bonding pad areas and the exposed surface portions of the lower electrical circuit pattern defining a plurality of generally circularly-shaped, electrically conductive ball land areas in a spaced-apart array for accommodating an array of spaced-apart, substantially spherically-shaped electrical conductors for a ball grid array (BGA), wherein each of the generally circularly-shaped ball land areas further includes an electrically conductive contact area extending from the periphery thereof for facilitating electrical contact to the upper and the lower electrical circuit patterns during processing for electroplating thereon.

According to embodiments of the present invention, the electrically insulative substrate comprises a material selected from the group consisting of polymers, ceramics, glass, resins, laminates, and composites thereof; the masking material comprises a solder mask material; and each of the upper and the lower electrical circuit patterns comprises a plurality of copper (Cu) or Cu-based traces with sequentially plated nickel (Ni) and gold (Au) layers thereon.

Additional advantages and aspects of the present invention will become apparent to those skilled in the art from the following detailed description, wherein embodiments of the invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWING

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

The present invention is based upon the discovery that simultaneous electroplating of both major surfaces of a workpiece in the form of a dual-sided, electrically insulative substrate having electrically interconnected, multi-trace circuit patterns on both major surfaces, e.g., printed circuit boards, can be readily performed without requiring the presence of electrically conductive tie bars for providing electrical contact to each of the electrically conductive traces forming the circuit patterns. A key feature of the present invention is the utilization of a multi-fingered electrical contactor arrangement for effecting simultaneous electrical contact to each of the conductive traces on one major surface of the dual-sided substrate for effecting simultaneous electroplating of at least one metal or metal alloy layer on both substrate surfaces. As a consequence of the inventive methodology, the need for processing steps for formation and severing (or even removal) of electrically conductive tie bars and associated lateral extensions, is eliminated, leading to process simplification and increase in the surface area available for circuit pattern formation. In addition, the inventive methodology advantageously provides an increase in the SNR of the completed device packages vis-à-vis device packages fabricated according to conventional practices.

Figure 1:
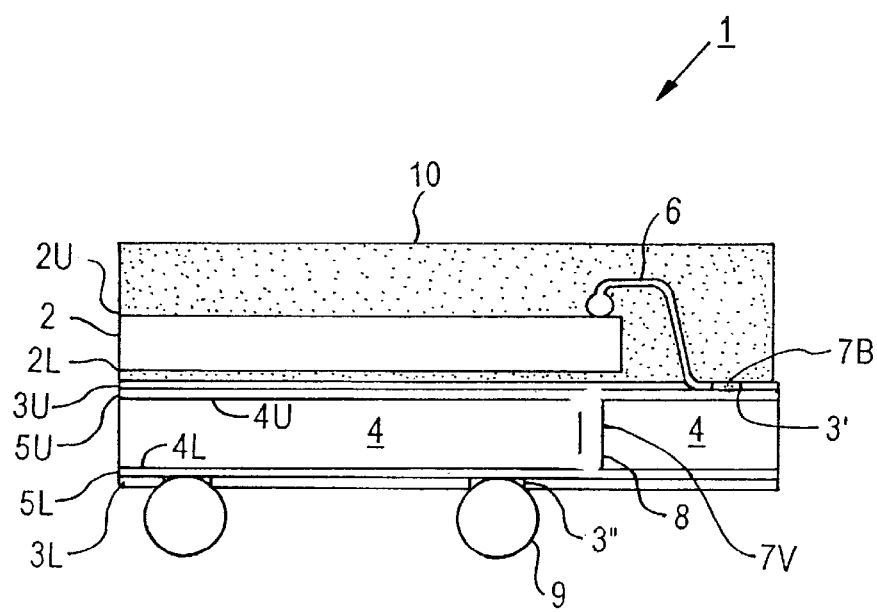
FIG. 1 is a schematic, cross-sectional view of a BGA type semiconductor IC device package comprising a dual-sided substrate prepared according to the principle of the present invention.
Figure 2A:
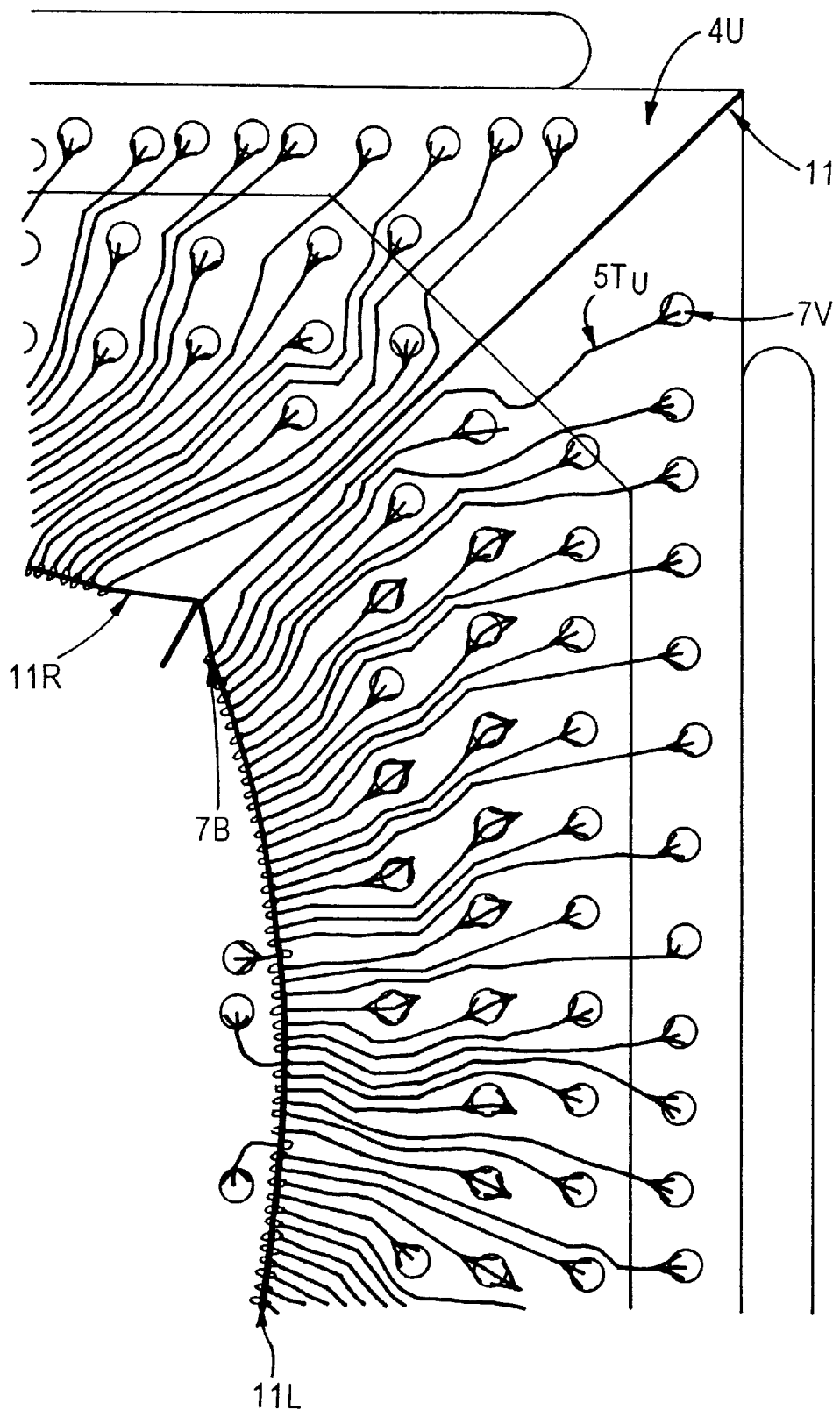
FIGS. 2A–2B are schematic plan views illustrating corner portions of the upper surface of dual-sided substrates respectively utilizing a single and plural electrically conductive tie bars according to the conventional art.
Figure 2B:
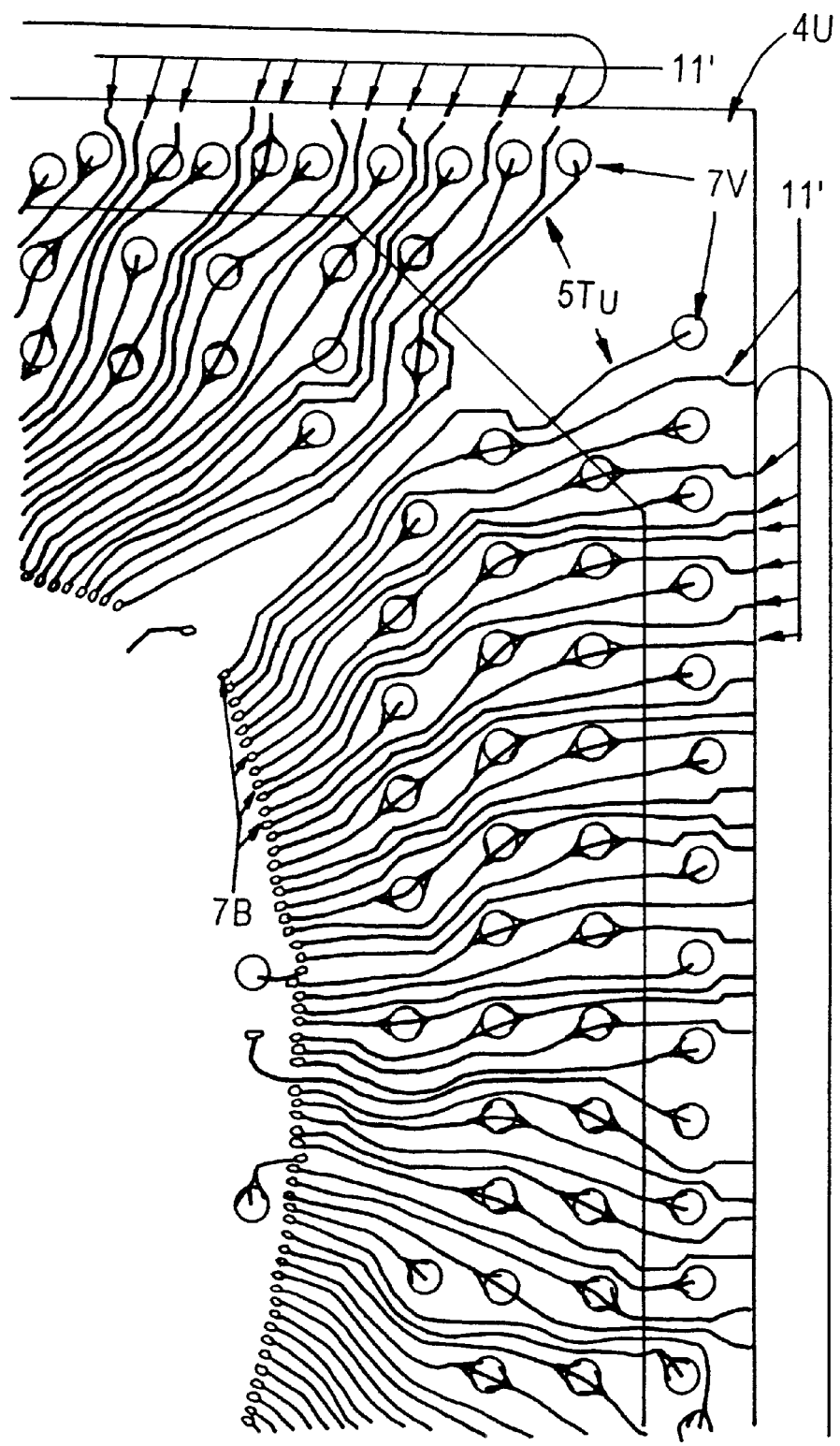

According to a first step of the present invention, a workpiece comprising a suitable dual-sided substrate is provided, e.g., of conventional type such as employed in the fabrication of electrical and electronic components and devices, for example, in the BGA type semiconductor IC device package shown in FIG. 1 and described supra. By way of illustration only, and with continuing reference to FIGS. 1–2, a suitable workpiece for use according to the present invention is a flat planar substrate (4) having a pair (i.e., upper and lower) of opposed major surfaces (4U, 4L) and is comprised of at least one electrically insulative material selected from polymers, ceramics, glasses, resins, and laminates and composites thereof, e.g., an epoxy resin-fiberglass composite. Circuit patterns (5U, 5L), such as shown in the plan view of FIG. 2 described above, and comprised of a plurality of electrically conductive traces ($5T_u$, $5T_L$) of e.g., copper (Cu) or a Cu-based alloy, configured for use in a particular application, are formed, as by conventional techniques, including inter alia, electroplating, photolithographic masking and etching, laser drilling, metal filling, etc., on each of the upper and lower major surfaces of the substrate and electrically interconnected by means of conductive via plugs (7V) filling a plurality of through-holes (8) extending through the thickness of the substrate.

According to a second step of the embodiment, a layer of a suitable masking material (3U, 3L) is applied to each of the major surfaces of the substrate so as to cover the respective circuit patterns (5U, 5L) thereon. Illustratively, the layers may comprise a solder mask material, e.g., for facilitating subsequent electrical contacts to the circuit patterns by solder-type bonding processes.

In the third step of the embodiment, selected portions of each of the masking material layers (3U, 3L) are removed, as by conventional photolithographic masking and etching techniques, to expose selected areas of the electrically conductive traces which form the respective circuit patterns, e.g., bonding pad areas or "fingers" (3') of the circuit pattern on the upper surface of the substrate and "ball land areas" (3") of the circuit pattern on the lower surface of the substrate.

Figures 3, 4:
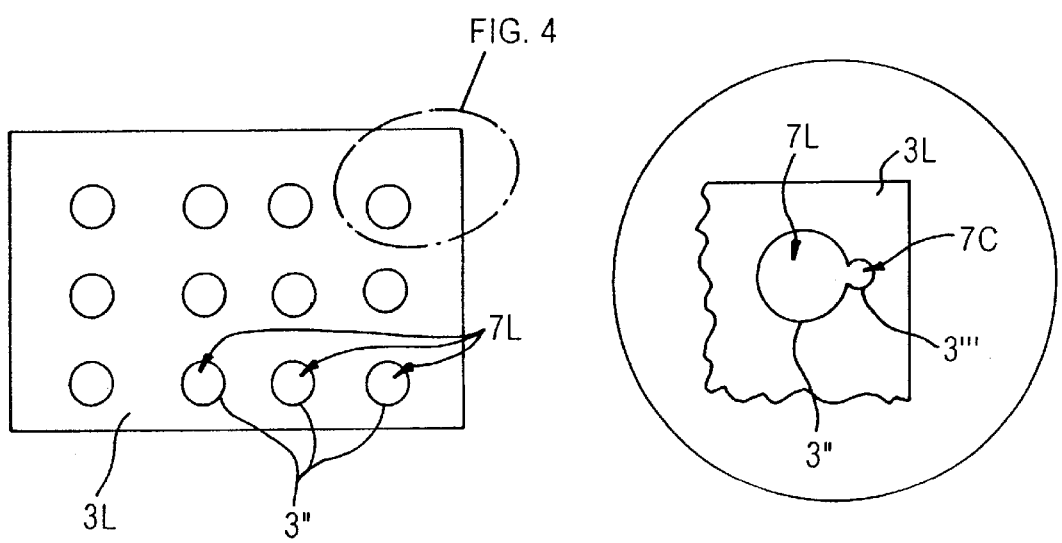
FIG. 3 is a schematic plan view of the lower surface of the dual-sided substrate of FIGS. 1 and 2, illustrating the array of ball landing areas formed in the layer of solder mask material.
FIG. 4 is an enlarged, schematic plan view of a ball landing area of FIG. 3 illustrating the associated electrical contact area.

Adverting to FIG. 3, shown therein, in schematic plan view, is a typical arrangement of openings (3") in the lower solder masking layer (3L) forming a two-dimensional grid-shaped array of generally circularly-shaped ball land areas (7L) of the lower circuit pattern (5L), for use in fabricating BGA-type device packages. As should be understood, each of the electrically conductive ball land areas (7L) of the lower circuit pattern (5L) is electrically connected, through a conductive via (7V), to at least one electrically conductive bonding pad area (7B) of the upper circuit pattern (5U).

Referring now to FIG. 4, shown therein, in enlarged view, is a preferred configuration of the ball landing areas according to the present invention. According to this embodiment, each of the openings (3") formed in the lower solder masking layer (3L) for exposing a respective ball landing area (7L) includes at the periphery thereof a generally circularly-shaped extending portion (3'") of smaller diameter, defining a relatively smaller contact area (7C) contiguous with and thus in electrical communication with the ball landing area (7L). The configuration of FIG. 4 advantageously permits electrical contact to the ball land areas without blocking, obscuring, or otherwise restricting access of same to the electroplating bath, thereby ensuring complete plating of the entire ball landing areas destined to receive the generally spherically-shaped contacts (9) in subsequent processing to form the ball grid array.

Figure 5A:
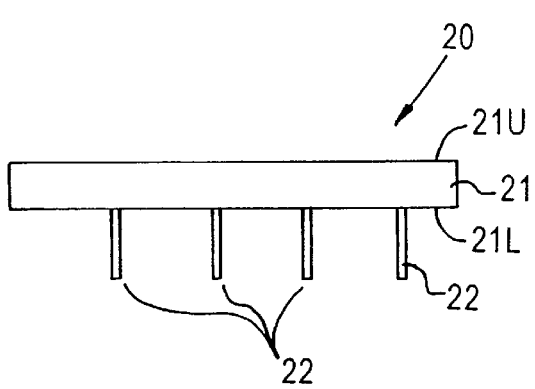
FIGS. 5(A) and 5(B), respectively, are schematic cross-sectional and plan views of a simultaneous electrical contactor arrangement according to the present invention.
Figure 5B:
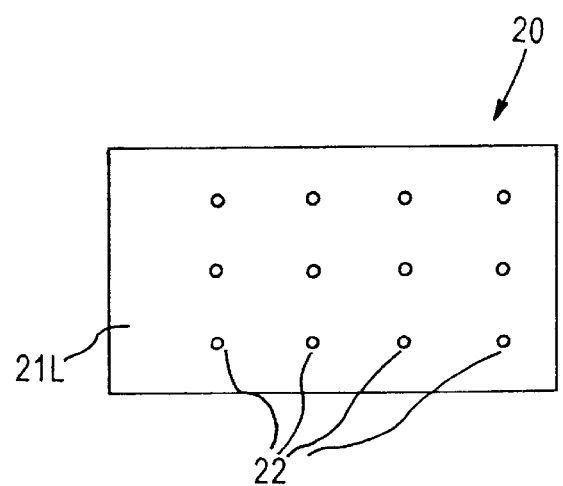

FIGS. 5(A) and 5(B), respectively, illustrate schematic, cross-sectional and plan views of a multi-fingered electrical contactor (20) suitable for use in the present invention, comprising a substantially rigid, metal, thus electrically conductive, plate (21) with upper and lower major surfaces (21U, 21L) and having a plurality of metal, thus electrically conductive, wires, rods, or filaments (22) of substantially equal width (or diameter) and length conductively affixed to and extending from one of the major surfaces thereof, e.g., the lower major surface (21L). The width (or diameter) and spacing of the wires, rods, or filaments (22) are selected for use with a particular workpiece, i.e., according to the number, dimensions, spacings, etc. of the features comprising the circuit pattern on one side of a dual-sided substrate. In the illustrated embodiment, wherein the workpiece to be electroplated comprises a dual-sided substrate with a two-dimensional array of ball landing areas (7L) with respective, relatively small contact areas (7C) on one side as shown in FIG. 4, the wires, rods, or filaments (22) are spaced apart a distance corresponding to that of the ball landing areas (7L) and have a narrow width or diameter for contacting only a central portion of the contact areas (7C).

In use, the contactor (20) is initially positioned opposite the workpiece with the wires, rods, or filaments (22) facing and aligned with the contact areas (7C) of the workpiece. Alignment is facilitated by use of a frame-like holder for accommodating the contactor and workpiece in spaced-apart, facing relation. The contactor and workpiece are then moved relative to each other to decrease the spacing therebetween, until each of the wires, rods, or filaments (22) is urged into touching electrical contact with a respective contact area (7C).

According to the next step of the invention, the workpiece (i.e., substrate), along with the multi-fingered electrical contactor in touching with each of the contact areas, as described above, is immersed in at least one metal or metal alloy plating bath, along with a suitable counter-electrode (i.e., an anode), for electroplating of at least one metal or metal alloy layer on the exposed electrically conductive areas of both major surfaces of the substrate, by applying a cathodic electrical potential simultaneously to the upper and lower circuit patterns via the multi-fingered electrical contactor. According to the illustrated embodiment, electroplating current flows from the power supply to the lower circuit pattern to effect electroplating of the exposed surface areas thereof, via the multi-fingered electrical contactor in touching electrical contact with the electrical contact areas of the ball land areas, the latter being in electrical contact with the electrically conductive vias which in turn contact the various traces of the upper circuit pattern. By way of illustration only, nickel (Ni) and gold (Au) layers may be sequentially plated from suitable Ni and Au plating baths onto Cu or Cu-based traces for increasing corrosion resistance and facilitating solder bonding thereto in later processing.

Electroplating onto the surfaces of the wire, filament, or rod-like fingers of the electrical contactor poses no problem when the latter is comprised of material(s) which provide(s) poor adhesion of the electroplated metal or alloy, such as stainless steel. Alternatively, electroplating on major portions of the electrical contactor surfaces can be avoided, for example, by applying an insulative paint, lacquer, or other suitable coating or sheathing to all surfaces thereof except the tips of the wires, filaments, or rods which electrically contact the exposed portions of the electrical circuit pattern.

After electroplating of Ni and Au layers on the exposed areas of the traces constituting the circuit patterns on the upper and lower major surfaces of the substrate, the thus-plated substrate is subjected to further processing steps of conventional nature, e.g., as described supra with respect to FIG. 1, to form a desired device or component, e.g., a BGA type semiconductor IC device package as illustrated in FIG. 1.

The inventive principle of utilizing a multi-fingered electrical contactor for electroplating dual-sided, electrical circuit-containing substrates and thereby eliminating the need for tie bars, is not limited to use with the illustrated embodiment involving formation of semiconductor IC die or chip-based devices, components, or packages. Rather, the inventive methodology can be utilized with all manner of dual-sided printed circuit boards ("PCB"s). Moreover, the invention can be effectively employed in instances where the patterned, insulative masking layer of the illustrated embodiment is not required to be formed over either of the circuit patterns, or need be formed over only one of the circuit patterns.

A number of advantages over conventional technology for electroplating of dual-sided substrates comprising electrically interconnected circuit patterns are thus provided by the inventive methodology, including, inter alia, elimination of the requirement for the provision (and at least partial removal) of tie bars and their associated lateral extensions, retention of the surface areas otherwise occupied by the tie bars and their lateral extensions for use in forming additional conductive traces, etc., of the circuit patterns, and an increase in the SNR of the completed device package.

In the previous description, numerous specific details have been set forth, such as specific materials, structures, processes, etc., in order to provide a better understanding of the present invention. However, the present invention can be practiced without resorting to the details specifically set forth. In other instances, well-known processing techniques and structures have not been described in detail in order not to unnecessarily obscure the present invention.

Only the preferred embodiments of the present invention and but a few examples of its versatility are shown and described in the present invention. It is to be understood that the present invention is capable of use in various other combinations and environments and is susceptible of changes and/or modifications within the scope of the inventive concept as expressed herein.

What is claimed is:

1. A method of electroplating a dual-sided workpiece, which method comprises the steps of:
   (a) providing a workpiece comprising an electrically insulative substrate including first and second of opposed major surfaces, with respective first and second pluralities of electrically conductive features formed on said first and said second major surfaces, each one of said first plurality of electrically conductive features on said first major surface being electrically interconnected to at least one of said second plurality of electrically conductive features on said second major surface;
   (b) providing an electrical contactor in simultaneous touching electrical contact with each feature of one of said first and second pluralities of electrically conductive features; and
   (c) contacting said first and said second major surfaces of said substrate with at least one electroplating bath while applying an electrical potential to said electrical contactor, and simultaneously electroplating at least one layer on said first and said second pluralities of electrically conductive features.

2. The method as in claim 1, wherein:
step (a) comprises providing as said workpiece a dual-sided circuit board comprising a substrate having flat planar first and second opposed major surfaces, wherein said first and said second pluralities of electrically conductive features each include a plurality of spaced-apart, electrically conductive traces forming respective first and second electrical circuit patterns, and said pluralities of electrically conductive traces of said first and said second electrical circuit patterns are electrically interconnected by a plurality of electrically conductive vias extending through the thickness of said substrate.

3. The method as in claim 2, wherein:
step (a) comprises providing as said workpiece a substrate wherein the entire surface areas of each of said first and said second electrical circuit patterns are exposed.

4. The method as in claim 2, wherein:
step (a) comprises providing as said workpiece a substrate wherein the entire surface area of one of said electrical circuit patterns is exposed and only selected portions of the other electrical circuit pattern are exposed through openings formed in an overlying layer of masking material.

5. The method as in claim 2, wherein:
step (a) comprises providing as said workpiece a substrate wherein only selected portions of the surface areas of each of said first and said second electrical circuit patterns are exposed through openings formed in a respective overlying layer of masking material.

6. The method as in claim 5, wherein:
step (a) comprises providing a substrate for a semiconductor device package having a ball grid array (BGA) contact arrangement, each of said layers of masking material comprises a solder mask material, and said selected portions of said first and second electrical circuit patterns exposed through said openings in the respective overlying layers of solder mask material form bonding pad areas on said first major surface and a spaced-apart array of generally circularly-shaped ball land areas on said second major surface.

7. The method as in claim 6, wherein:
step (a) comprises providing a substrate for a BGA contact arrangement wherein each of said generally circularly-shaped ball land areas further includes an electrical contact area extending from the periphery thereof.

8. The method as in claim 7, wherein:
step (b) comprises providing said electrical contactor in simultaneous touching electrical contact with each of said electrical contact areas of said spaced-apart array of ball land areas.

9. The method as in claim 8, wherein:
step (b) comprises providing as said electrical contactor an electrically conductive plate, with one end of each of a plurality of electrically conductive wires, filaments, or rods conductively affixed to one side of said plate, said plurality of wires, filaments, or rods extending from said one side of said plate in a spaced-apart array configured to correspond to said spaced-apart array of ball land areas, and urging the other, free end of each of said plurality of wires, filaments, or rods into touching electrical contact with a respective electrical contact area.

10. The method as in claim 2, wherein:
step (a) comprises providing a dual-sided circuit board comprising at least one insulative material selected from the group consisting of polymers, ceramics, glasses, resins, laminates, and composites thereof.

11. The method as in claim 2, wherein: step (c) comprises electroplating at least one metal or metal alloy layer on said first and second pluralities of electrically conductive features.

12. The method as in claim 2, wherein:
step (a) comprises providing a dual-sided circuit board including first and second pluralities of copper (Cu) or Cu-based features; and
step (c) comprises sequentially electroplating nickel (Ni) and gold (Au) layers thereon.

13. A method of manufacturing a semiconductor device, comprising:
 (a) providing an electrically insulative substrate having substantially planar upper and lower major surfaces, each of said upper and said lower major surfaces including thereon a plurality of electrically conductive traces forming respective upper and lower electrical circuit patterns, said traces of said upper electrical circuit pattern being electrically interconnected with said traces of said lower electrical circuit pattern by means of a plurality of electrically conductive vias extending through said substrate;
 (b) applying a layer of an electrically insulative masking material on each of said upper and said lower electrical circuit patterns;
 (c) selectively removing portions of each layer of masking material to expose selected surface portions of the plurality of electrically conductive traces comprising each of said upper and said lower electrical circuit patterns;
 (d) providing an electrical contactor in simultaneous touching electrical contact with each selected surface portion of one of said upper and said lower electrical circuit patterns; and
 (e) contacting said upper and said lower surfaces of said substrate with at least one electroplating bath while applying a cathodic electrical potential to said electrical contactor, and simultaneously electroplating at least one metal or metal alloy layer on the exposed surface portions of said upper and said lower electrical circuit patterns.

14. The method as in claim 13, wherein:
step (a) comprises providing an electrically insulative substrate comprised of a material selected from the group consisting of polymers, ceramics, glass, resins, laminates, and composites thereof,
step (b) comprises applying a layer of a solder mask material on each of said upper and said lower major surfaces of said substrate and covering the respective upper and lower electrical circuit patterns; and
step (c) comprises selectively removing portions of said solder mask layer from said upper circuit pattern to expose a plurality of electrically conductive bonding pad areas and selectively removing portions of said solder mask layer from said lower circuit pattern to expose a plurality of generally circularly-shaped ball land areas in a spaced-apart array for accommodating an array of spaced-apart, substantially spherically-shaped electrical conductors for a ball grid array (BGA).

15. The method as in claim 14, wherein:
step (c) includes forming an electrically conductive contact area extending from the periphery of each of said generally circularly-shaped, exposed, ball land areas of said lower circuit pattern; and
step (d) comprises providing as said electrical contactor an electrically conductive plate, with one end of each of a plurality of electrically conductive wires, filaments, or rods conductively affixed to one side of said plate, said plurality of wires, filaments, or rods extending from said one side of said plate in a spaced-apart array configured to correspond to said array of ball land areas, and urging the other, free end of each of said plurality of wires, filaments, or rods into touching electrical contact with a respective electrical contact area.

16. The method as in claim 15, wherein:
step (a) comprises providing an insulative substrate wherein each of said upper and lower electrical circuit patterns includes a plurality of copper (Cu) or Cu-based traces; and
step (e) comprises sequentially electroplating a nickel (Ni) layer and a gold (Au) layer on each of said exposed areas of each of said upper and said lower electrical circuit patterns.

17. The method as in claim 16, further comprising the steps of:
 (f) affixing a substantially spherically-shaped electrical conductor to each of said plurality of exposed ball land areas of said lower electrical circuit pattern to form a ball grid array (BGA);
 (g) mounting a semiconductor integrated circuit (IC) die or chip on said layer of solder mask material on said upper major surface of said substrate;
 (h) forming at least one electrical connection between said IC die or chip and at least one of said bonding pad areas of said upper electrical circuit pattern; and
 (i) encapsulating at least said IC die or chip in a molding material.

* * * * *